US006578260B1

(12) United States Patent
Dixon et al.

(10) Patent No.: US 6,578,260 B1
(45) Date of Patent: Jun. 17, 2003

(54) METHOD FOR ASSEMBLING A MULTI-DECK POWER SUPPLY DEVICE

(75) Inventors: Duane E. Dixon, Tucson, AZ (US); Marty Perry, Tucson, AZ (US); Ian Poynton, Marana, AZ (US)

(73) Assignee: Artesyn Technologies, Inc., Boca Raton, FL (US)

( * ) Notice: Subject to any disclaimer, the term of this patent is extended or adjusted under 35 U.S.C. 154(b) by 90 days.

(21) Appl. No.: 09/693,016

(22) Filed: Oct. 20, 2000

(51) Int. Cl.[7] .................................................. H05K 3/36
(52) U.S. Cl. .............................. 29/830; 29/840; 29/842; 29/843
(58) Field of Search .......................... 29/830, 840, 843, 29/842, 876; 228/212, 264, 19, 20, 119

(56) References Cited

U.S. PATENT DOCUMENTS

| | | | | |
|---|---|---|---|---|
| 3,938,245 A | * | 2/1976 | Lovendusky et al. | 227/2 |
| 5,092,029 A | * | 3/1992 | Fisher et al. | 29/739 |
| 5,933,343 A | * | 8/1999 | Lu et al. | 361/790 |
| 5,973,923 A | | 10/1999 | Jitaru | |
| 6,005,773 A | | 12/1999 | Rozman et al. | |
| 6,200,159 B1 | * | 3/2001 | Chou | 174/48 |
| 6,201,306 B1 | * | 3/2001 | Kurosawa et al. | 228/102 |

* cited by examiner

Primary Examiner—Joseph J. Hail, III
Assistant Examiner—Alvin J. Grant
(74) Attorney, Agent, or Firm—Kirkpatrick & Lockhart LLP

(57) ABSTRACT

A method for assembling a multi-deck power supply device including control and power components. The method comprises providing a first circuit board having a first and a second side. Two prefabricated pin holders are positioned on the first side of the first circuit board. Each pin holder includes two threaded inserts, a set of first pins and a set of second pins. The first pins are floating for self-alignment during soldering. After the first pins are soldered on the first side of the first circuit board, a second circuit board is aligned above the first circuit board, and the first and second pins are soldered to the second circuit board. The first pins may include pre-assembled oscillation dampers, such as magnetic material beads.

26 Claims, 4 Drawing Sheets

SECTION A-A

SECTION A-A

METHOD FOR ASSEMBLING A MULTI-DECK POWER SUPPLY DEVICE

CROSS-REFERENCE TO RELATED APPLICATIONS

Not applicable.

FEDERALLY SPONSORED RESEARCH

Not applicable.

BACKGROUND OF THE INVENTION

1. Field of the Invention

The invention relates to multi-deck power supply devices, and more particularly to a method for assembling a multi-deck power supply device.

2. Description of the Invention Background

Power supply devices and in particular power converters, such as DC-DC converters, are used in applications such as, for example, telecommunications, data communications, electronic data processing, and distributed power architecture. Driven by these applications, there has been an increase in demand for smaller devices that are still highly efficient. To satisfy this need, the multi-deck approach in which two or more circuit boards are stacked one above the other and are electrically interconnected has been developed.

U.S. Pat. No. 5,933,343 discloses a multi-deck power converter comprising a first and a second circuit board connected with spacers. Two rail members are positioned over the second circuit board. The rail members have a plurality of holes to receive the spacers and a plurality of pins from the first and second circuit board. The spacers also include threaded through holes to attach a heat sink or another board. In addition to saving space by stacking one circuit board above another circuit board, the open-frame construction of this modular device allows for better air flow and heat dissipation. This and other prior art devices, however, have the disadvantage of increased manufacturing costs and time inefficiencies, mainly because of the increased number of parts that must be assembled, such as spacers and rails in addition to the circuit boards and the connecting pins.

There remains, therefore, a need for an improved method of assembling a multi-deck power supply device that overcomes the limitations, shortcomings and disadvantages of the prior-art power supply devices without compromising their advantages.

SUMMARY OF THE INVENTION

The invention meets the identified needs, as well as other needs, as will be more fully understood following a review of this specification and drawings.

One aspect of the invention includes an efficient method for assembling a multi-deck power supply device, which includes control and power components, has an open-frame construction for improved air flow and is light-weight and space conserving. The method comprises providing a first circuit board having a first and a second side. The second side of the first circuit board is typically mounted on a metal substrate. Two prefabricated pin holders are positioned on the first side of the first circuit board. Each pin holder includes two threaded inserts, a set of first pins and a set of second pins. The first pins are floating for self-alignment during soldering. After the first pins are soldered on the first side of the first circuit board, a second circuit board is aligned above the first circuit board, and the first and second pins are soldered to the second circuit board. The first pins may include a pre-assembled oscillation damper, such as magnetic material beads.

Each pin holder has a recess for receiving the second circuit board and is shaped to allow air circulation between the first and second circuit boards, generally having an H-shape. The power components of the power supply device, typically having high-profile, are positioned on the first side of the first circuit board. The control components, typically having low-profile, are positioned on a side of the second circuit board that faces the first circuit board.

Other features, aspects and advantages of the invention will become apparent from the detailed description of the embodiments of the invention set forth herein and from the claims appended thereto.

DETAILED DESCRIPTION OF THE INVENTION

Figure 1:
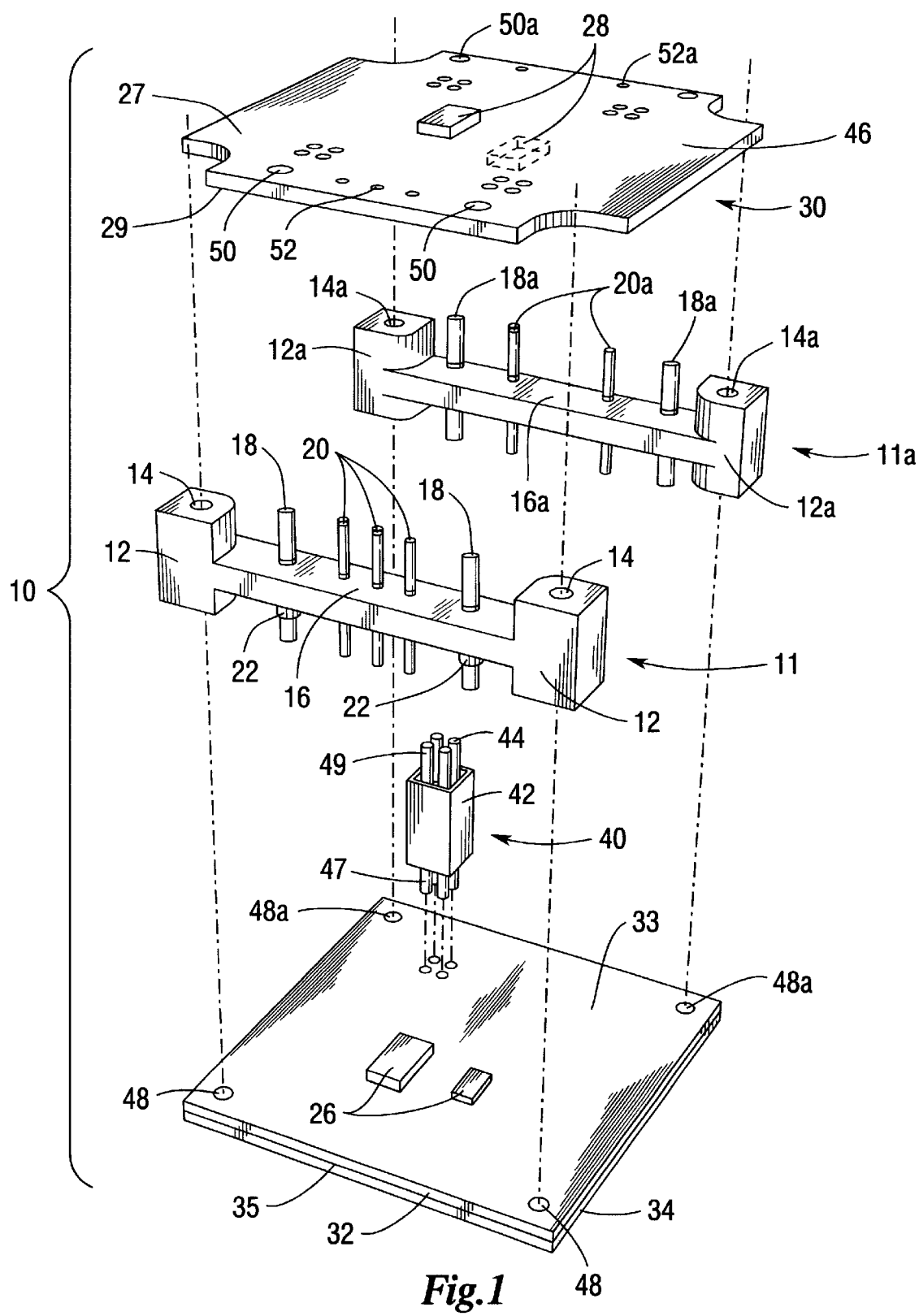
FIG. 1 is an exploded view of a multi-deck power supply device according to an embodiment of the invention.

Referring now to the drawings for the purpose of illustrating the invention and not for he purpose of limiting the same, FIG. 1 is an exploded view of a multi-deck power supply device 10, which includes a first circuit board 32 mounted on a metal substrate 34, two prefabricated pin holders 11 and 11a, a second circuit board 30 and four interconnectors 40 (only one is shown in FIG. 1 ). The first circuit board 32 may be a power board having a first side 33 and a second side 35 and a number of electronic components 26 mounted on the first side 33. The components 26, which are mounted on the first circuit bodard 32 are components associated with the power handling functions of the power supply device, such as, for example, transformers, and generally generate a relatively large amount of heat. Such components are termed "high profile" components herein. The metal substrate 34 allows heat dissipation from the high-profile components through exposure to airflow when the device is in use. The multi-deck power supply device 10 may be a DC/DC converter, such as Part No. EXB250 of the ½ pack model series by Artesyn Technologies, although other devices, including ¼ pack converters, may be assembled according to the invention as described herein.

Figure 2:
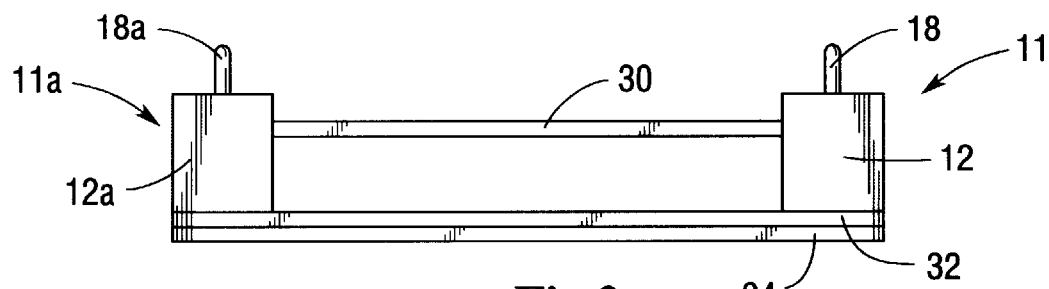
FIG. 2 is a side elevational view of the multi-deck power supply device of FIG. 1 with selected components omitted.
Figure 3:
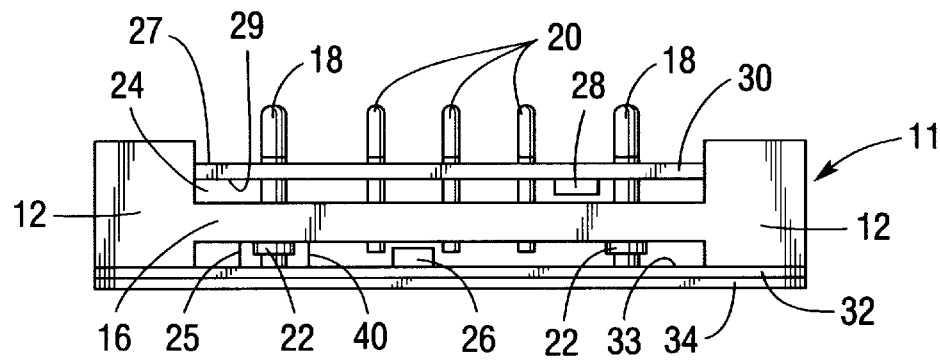
FIG. 3 is a front elevational view of the multi-deck power supply device of FIG. 1 with selected components omitted.
Figure 4:
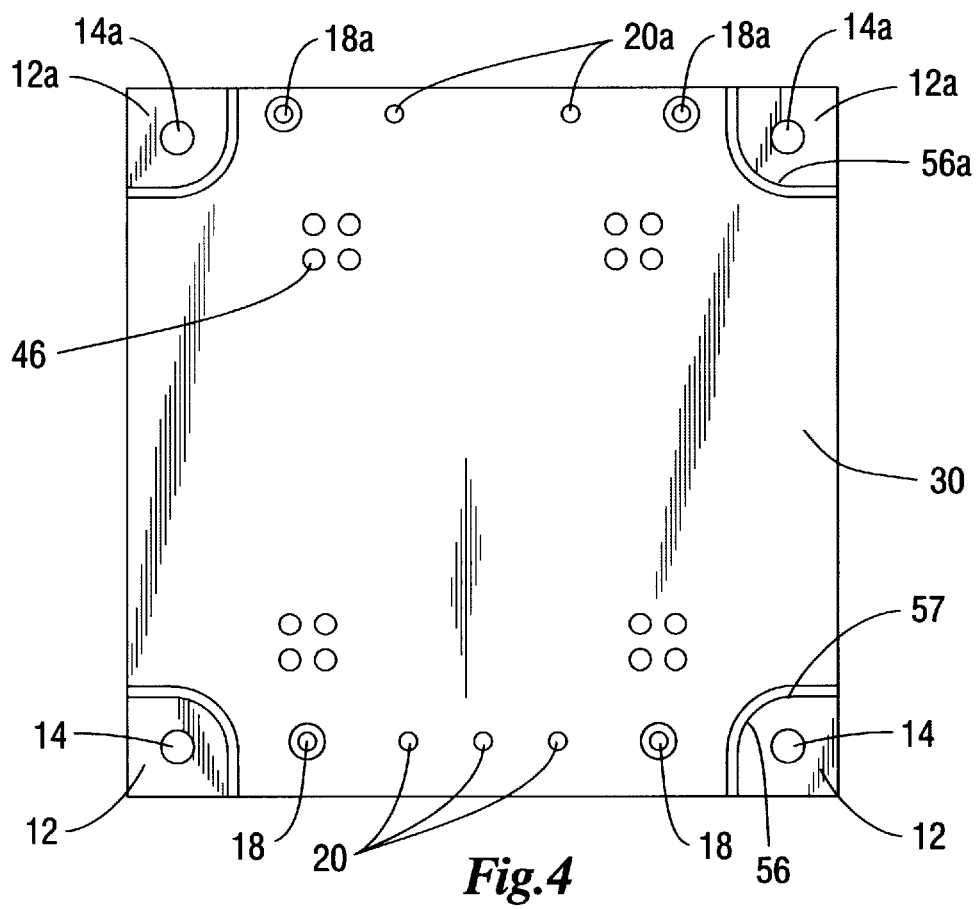
FIG. 4 is a top plan view of the multi-deck power supply device of FIG. 1.

Referring to FIGS. 1–6(b), the second circuit board 30 may be a control board having a number of electronic components 28 mounted on its first side 29, as shown in FIG. 3. Electronic components may also be mounted on the second side 27 of the second circuit board 30. Control components, such as, for example, resistors and capacitors, are generally smaller and generate less heat than power components. Such components are termed "low-profile" components herein.

Each prefabricated pin holder 11, 11a comprises two blocks 12, 12a connected to and at the ends of an arm 16, 16a. Each pin holder 11, 11a also includes a set of first pins 18, 18a and a set of second pins 20, 20a. The first pins 18, 18a extend through the arm 16, 16a and to the first circuit board 32 for electrical connection thereto. Each pin holder block 12, 12a may include a threaded insert 14, 14a, such that the threaded inserts 14, 14a are aligned with respective apertures 48, 48a on the first circuit board 32 and substrate 34 when the device is assembled. The threaded inserts 14, 14a are available, for example, for connecting a heat sink to the metal substrate 34 or for attaching another circuit board. The threaded inserts 14, 14a also allow mechanical attachment to the metal substrate 34, minimizing mechanical stresses to any pin solder attached to the first circuit board. This is done by means of fasteners, such as screws, or by merely swaging insert material into the metal substrate 34. In the pin holder embodiments 11, 11a, the threaded inserts are not attached to the metal substrate. The threaded inserts are preferably made of stainless steel, but other materials may be used, such as brass. Additionally, the first pins 18, 18a of one or both pin holders 11, 11a may be provided with magnetic material beads 22, which are used to attenuate noise and isolate parasitic oscillations or add inductance to the pins. Such beads may be made of ferrite or powdered iron and are commercially available in donut or tubular shapes. Powdered iron beads are typically the preferred alternative because of their lower cost, and are available, for example, from Micrometals, Inc., Part No. T20-26G/94. It will be appreciated that other types of noise reduction devices may be included pre-assembled or even molded with the pin holders in connection with any of the pins as needed by a particular application.

The pin holders 11, 11a are prefabricated before assembling the multi-deck power supply device. Typically, the pin holder fabrication process includes providing a mold and inserting the threaded inserts into the mold. Then the pin holder material is injected into the mold. The pin holder material has insulating properties and may comprise Polyphenylene Sulfide (PPS) with 40% glass fill. After the pin holder is molded, magnetic material beads may be inserted in one of the pin holders at the location of the first set of pins, typically the first pins 18 that are associated with voltage output, although magnetic material beads may be used in both pin holders 11, 11a for all the first pins 18, 18a. The first and second pins are then inserted into the pin holders. FIG. 1 shows one pin holder 11a with two second pins 20a and one pin holder 11 with three second pins 20. The first pins 18, 18a flank the second pins 20, 20a on each side.

Figure 5A:
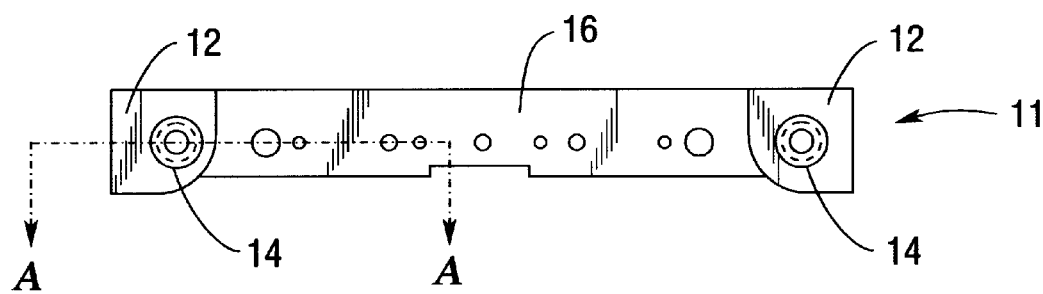
FIG. 5(a) is a top plan view of an embodiment of a pin holder as may be used in the invention.
Figure 5B:
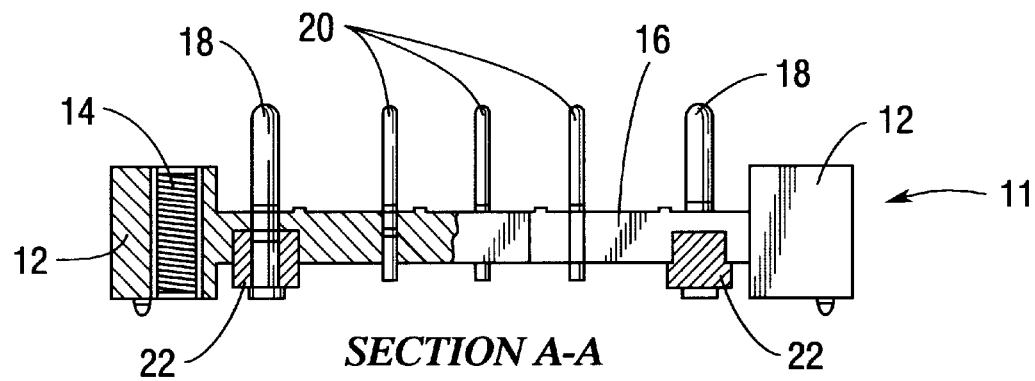
FIG. 5(b) is a side elevational view of the pin holder of FIG. 5(a) showing section A—A.
Figure 5C:
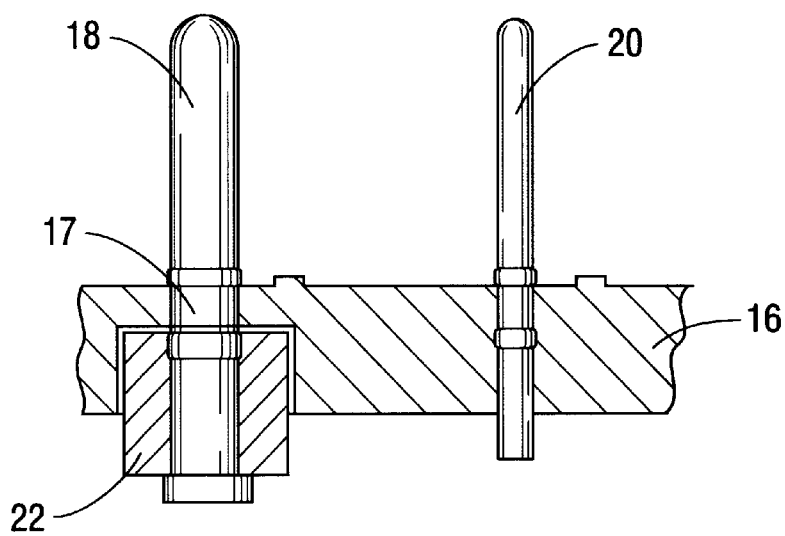
FIG. 5(c) is a detail of the pin holder of FIG. 5(a) showing a section of a magnetic material bead.

FIGS. 5(a) and (b) are top plan and side/section views respectively an embodiment of one pin holder 11. The section view A—A shows the tubular magnetic material beads 22 aligned with the holes into which the first pins are inserted. The magnetic material beads 22 are pushed against recesses molded into the arm 16 of the pin holder. A detail of a magnetic material bead 22 with the associated first pin 18 is shown in FIG. 5(c). The first pins 18 are inserted into at least one pin holder 11 through the magnetic material beads 22, so that they are "floating", i.e. axial motion of each first pin in the direction of the pin is possible, typically approximately 0.007 inches about a position 17 in relation to the arm 16 of the pin holder 11. This motion, as well as some play on the plane perpendicular to the direction of the first pins 18, allows self-alignment, i.e. more accurate alignment of the first pins 18 prior to soldering them onto the first circuit board 32.

Figure 6A:
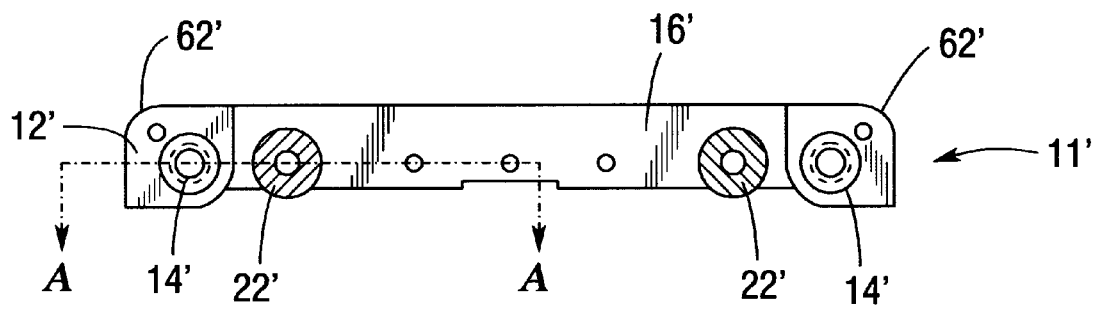
FIG. 6(a) is a top plan view of another embodiment of a pin holder as may be used in he invention.
Figure 6B:
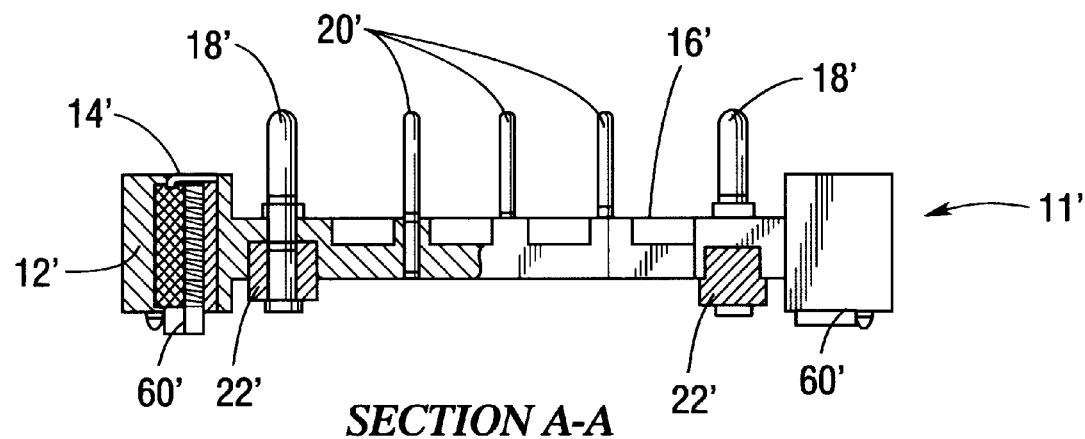
FIG. 6(b) is a side elevational view of the pin holder of FIG. 6(a) showing section A—A.

FIGS. 6(a) and (b) are top plan and side/section views respectively of another embodiment of one pin holder 11', which, similarly to the above described pin holder embodiment 11, includes two blocks 12' connected by an arm 16', first pins 18', second pins. 20', threaded inserts 14' and powdered iron beads 22'. In this embodiment, the outside corners 62' of the blocks 12' are rounded to improve heat removal by airflow by promoting more laminar and less turbulent airflow, and the threaded inserts 14' include mechanical attachments 60' for attaching the pin holders 11' to the metal substrate 34. The mechanical attachments 60' are, for example, screws or similar fasteners that are threaded from the bottom of the metal substrate 34 to the threaded inserts 14'. Mechanical attachment may also include swaging insert material into the metal-substrate.

The prefabricated pin holders 11, 11a with their pins are positioned on the first circuit board 32 as shown in FIGS. 2 and 3. The high profile components 26 and the first pins 18, 18a of the prefabricated pin holders 11, 11a are soldered on the first side 33 of the first circuit board 32. For the pin holder embodiment 11', the mechanical attachments 60' may be attached to the metal substrate 34 after the first pins 18' are soldered, so that mechanical stresses to the pin solder are minimized.

The second circuit board 30 has components 28 soldered on its first side 29, and apertures 50, 50a and 52, 52a arranged to receive the first 18, 18a and second 20, 20a pins respectively. Depending on the application, all or some of the first pins 18, 18a and the respective apertures 50, 50a will have bigger diameters than those of the second pins 20, 20a typically about 0.08 inches diameter for the first pins 18 of one pin holder 11 and 0.04 diameter for the second pins 20, 20a. In the embodiment shown in FIG. 2, the first pins 18a associated with one of the pin holders, 11a, have the same diameter as the second pins. The second circuit board 30 may also have low-profile components 28 mounted on its second side 27.

After the pin holders 11, 11a have been connected to the first board 32, the second circuit board 30 is positioned over the first 18, 18a and second 20, 20a pins of the pin holders 11, 11a, and fits into a recess 24, 24a formed by the arm 16, 16a and the blocks 12, 12a of the pin holders 11, 11a. The first pins 18, 18a, the second pins 20, 20a and any components 28 that need to be mounted on the second side 27 of the second circuit board 30 are then soldered on to the second board. The shape of each pin holder 11, 11a, is such that not only it accommodates the second circuit board without interfering with the first 18, 18a and second 20, 20a pins, but it allows efficient air flow between the two boards and between the pin holders 11, 11a and the first circuit board 32. In the embodiment shown, the pin holders have a generally H-shape, but it will be appreciated that other shapes are within the purview of a person with ordinary skill in the art. The blocks 12, 12a of the pin holders 11, 11a may have rounded edges 56, 56a conforming to rounded edges 57 of the second circuit board 30.

The multi-deck power supply device 10 may include one or more four-pin interconnectors 40, which is shown in FIG. 1, but is omitted for reasons of clarity from FIGS. 2 and 3.

Each interconnector 40 comprises four interconnect pins 44 with first ends 47 and second ends 49. Each interconnector is positioned and soldered at the first ends 47 of the interconnect pins 42 on the first circuit board 32. The second ends 49 of the interconnect pins 44 pass through apertures 46 positioned to receive them on the second circuit board 30. Each interconnector 40 has a support member 42 extending in the axial direction of the corresponding interconnect pin 44. The support member is typically made of electrically insulating material, such as PM 9630, primarily maintains pin alignment during assembly and provides mechanical standoff between the first and second circuit boards. The spacing of the pins and the support member 42 are designed so that the nozzle of a standard pick-and-place machine can pick the device 10 during assembly, before mounting the second circuit board 30.

For a ½ pack power converter, typical dimensions of the device 10 are about 2.4 inches in the direction of the pin holders and about 2.28 inches in the direction perpendicular to the pin holders. The height of the device from the metal substrate to the top of the pin blocks is typically in the range of 0.48 to 0.52 inches, and the pins extend at least about 0.2 inches above the top of the pin blocks. It will be appreciated that the present method may be used to assemble a variety of power supply devices, including, for example, a ¼ pack DC-DC converter, and other converters with single or dual outputs.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the invention as described in the appended claims.

What is claimed is:

1. A method for assembling a multi-deck power supply device, the method comprising:
    providing a first circuit board;
    placing a prefabricated pin holder on a first side of the first circuit board, the pin holder having a threaded insert, a first pin and a second pin;
    soldering the first pin of the pin holder to the first circuit board;
    aligning a second circuit board above the first circuit board; and
    soldering the first pin and the second pin to the second circuit board.

2. The method of claim 1, wherein the pin holder includes a pre-assembled oscillation damper with the first pin.

3. The method of claim 1, wherein the pin holder includes a pre-assembled magnetic material bead with the first pin.

4. The method of claim 1, wherein the pin holder has a recess for receiving the second circuit board.

5. The method of claim 1, wherein the pin holder is shaped to allow air circulation between the first and second circuit boards.

6. The method of claim 5, wherein the pin holder is generally H-shaped.

7. The method of claim 1, further comprising attaching a metal substrate to a second side of the first circuit board.

8. The method of claim 7, further comprising attaching the threaded insert to the metal substrate.

9. The method of claim 1, further comprising soldering a four-pin interconnector to the first and second circuit board.

10. The method of claim 9, wherein the four-pin interconnector has a continuous lateral support member.

11. The method of claim 1, further comprising soldering a set of high-profile electrical components on the first circuit board.

12. The method of claim 1, wherein the first pin is axially slidable on the pin holder, and the method further comprises self-aligning the first pin for soldering on the first circuit board.

13. The method of claim 1, further comprising soldering a set of low-profile electrical components on a side of the second circuit board facing the first circuit board.

14. A method for assembling a first and second circuit board, the method comprising:
    providing a pair of prefabricated pin holders, each pin holder comprising:
        a set of first pins;
        set of second pins; and
        a set of threaded inserts;
    soldering the first pins to the first and second circuit boards, and soldering the second pins to the second board, so that the pin holders are substantially between the first and second circuit board.

15. The method of claim 14, wherein at least one first pin includes a pre-assembled oscillation damper.

16. The method of claim 14, wherein at least one first pin includes a pre-assembled magnetic material bead.

17. The method of claim 14, wherein each pin holder has a recess for receiving the second circuit board.

18. The method of claim 14, wherein the pin, holders are shaped to allow air circulation between the circuit boards.

19. The method of claim 18, wherein the pin holders are generally H-shaped.

20. The method of claim 14, further comprising attaching a metal substrate to the first circuit board.

21. The method of claim 20, further comprising attaching the threaded inserts to the metal substrate.

22. The method of claim 14, further comprising soldering a four-pin interconnector to the first and second circuit board.

23. The method of claim 22, wherein the four-pin interconnector has a continuous lateral support member.

24. The method of claim 14, further comprising soldering a set of high-profile electrical components on the first circuit board.

25. The method of claim 14, further comprising soldering a set of low-profile electrical components on the second circuit board facing the first circuit board.

26. The method of claim 14, wherein the first pins are axially slidable on the pin holders, and the method further comprises self-aligning the first pins for soldering on the first circuit board.

* * * * *